(12) United States Patent
Hendrickson

(10) Patent No.: US 7,075,798 B2
(45) Date of Patent: Jul. 11, 2006

(54) FLEXIBLE ISOLATION DEVICE THAT SHIELDS EMI SENSITIVE DEVICES FROM OUTSIDE INTERFERENCE

(75) Inventor: Ryan L. Hendrickson, Spokane, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/859,274

(22) Filed: Jun. 1, 2004

(65) Prior Publication Data
US 2005/0265012 A1   Dec. 1, 2005

(51) Int. Cl.
*H05K 9/00* (2006.01)
(52) U.S. Cl. ............... 361/818; 361/816; 361/800; 206/720
(58) Field of Classification Search ............... 361/818, 361/816, 800, 752; 224/236; 206/720; 174/51, 174/35 R
See application file for complete search history.

(56) References Cited

U.S. PATENT DOCUMENTS

| | | | | |
|---|---|---|---|---|
| 5,436,803 A | * | 7/1995 | Annis et al. | 361/818 |
| 5,534,663 A | * | 7/1996 | Rivers et al. | 174/35 GC |
| 5,791,485 A | * | 8/1998 | Carbonneau | 206/720 |
| 6,028,775 A | * | 2/2000 | Batten et al. | 361/816 |
| 6,667,436 B1 | * | 12/2003 | Takami et al. | 174/35 R |
| 6,717,047 B1 | * | 4/2004 | Haselby et al. | 174/35 R |
| 2004/0020959 A1 | * | 2/2004 | Sellars | 224/675 |

* cited by examiner

*Primary Examiner*—Randy W. Gibson
*Assistant Examiner*—Hung S. Bui

(57) ABSTRACT

An isolation device includes an upper portion, a lower portion, and an isolation area. At least one of the upper and lower portions is constructed with a flexible shielding material. The isolation device may also include a conduit having one opening in the isolation area and another opening outside the isolation area.

11 Claims, 3 Drawing Sheets

FLEXIBLE ISOLATION DEVICE THAT SHIELDS EMI SENSITIVE DEVICES FROM OUTSIDE INTERFERENCE

BACKGROUND

Isolation devices are used in a variety of applications, including product and quality testing of various electronic devices. The isolation devices shield the electronic devices from interference during the testing process, which allows the test procedure to more accurately reflect device operations. FIG. 1 is a perspective view of an isolation device according to the prior art. Isolation device 100 includes base 102, lid 104, and isolation area 106. Clasps 108, 110 attached lid 104 to base 102 when lid 104 is in the closed position.

Isolation device 100 is typically made of a rigid metallic material. The rigidity of the metallic material can limit the size and shape of the isolation device 100. Also, depending on the type of metallic material, its thickness, and the dimensions of isolation device 100, isolation device 100 can be expensive to manufacture and heavy and cumbersome to use.

SUMMARY

In accordance with the invention, an isolation device includes an upper portion, a lower portion, and an isolation area. At least one of the upper and lower portions is constructed with a flexible shielding material. The isolation device may also include a conduit having one opening in the isolation area and another opening outside the isolation area.

BRIEF DESCRIPTION OF THE DRAWINGS

The invention will best be understood by reference to the following detailed description of embodiments in accordance with the invention when read in conjunction with the accompanying drawings, wherein.

DETAILED DESCRIPTION

The invention relates to a flexible isolation device that shields EMI sensitive devices from outside interference. The following description is presented to enable one skilled in the art to make and use the invention, and is provided in the context of a patent application and its requirements. Various modifications to the disclosed embodiments will be readily apparent to those skilled in the art, and the generic principles herein may be applied to other embodiments. Thus, the invention is not intended to be limited to the embodiments shown, but is to be accorded the widest scope consistent with the appended claims and with the principles and features described herein.

Figure 1:
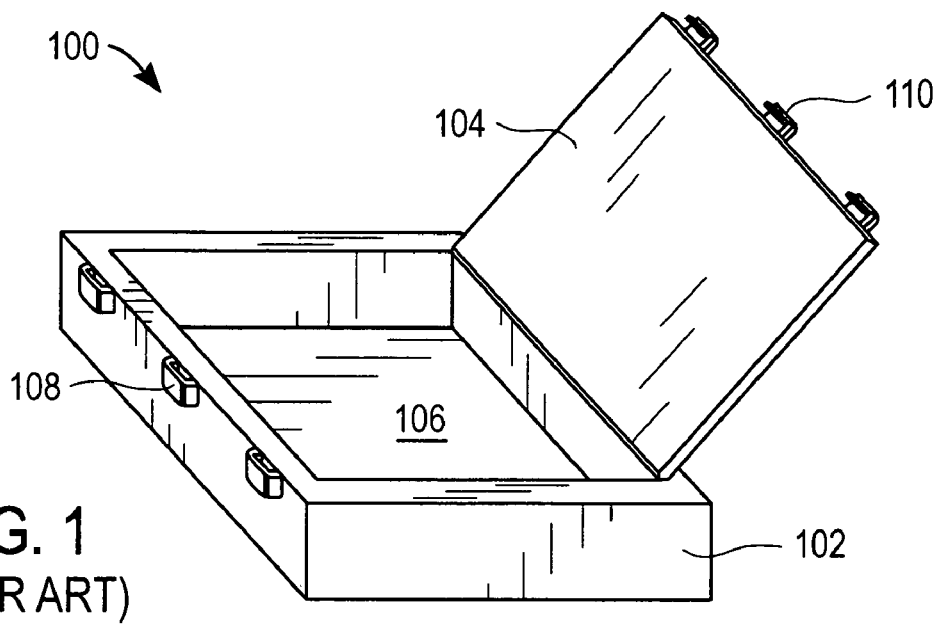
FIG. 1 is a perspective view of an isolation device according to the prior art.
Figure 2:
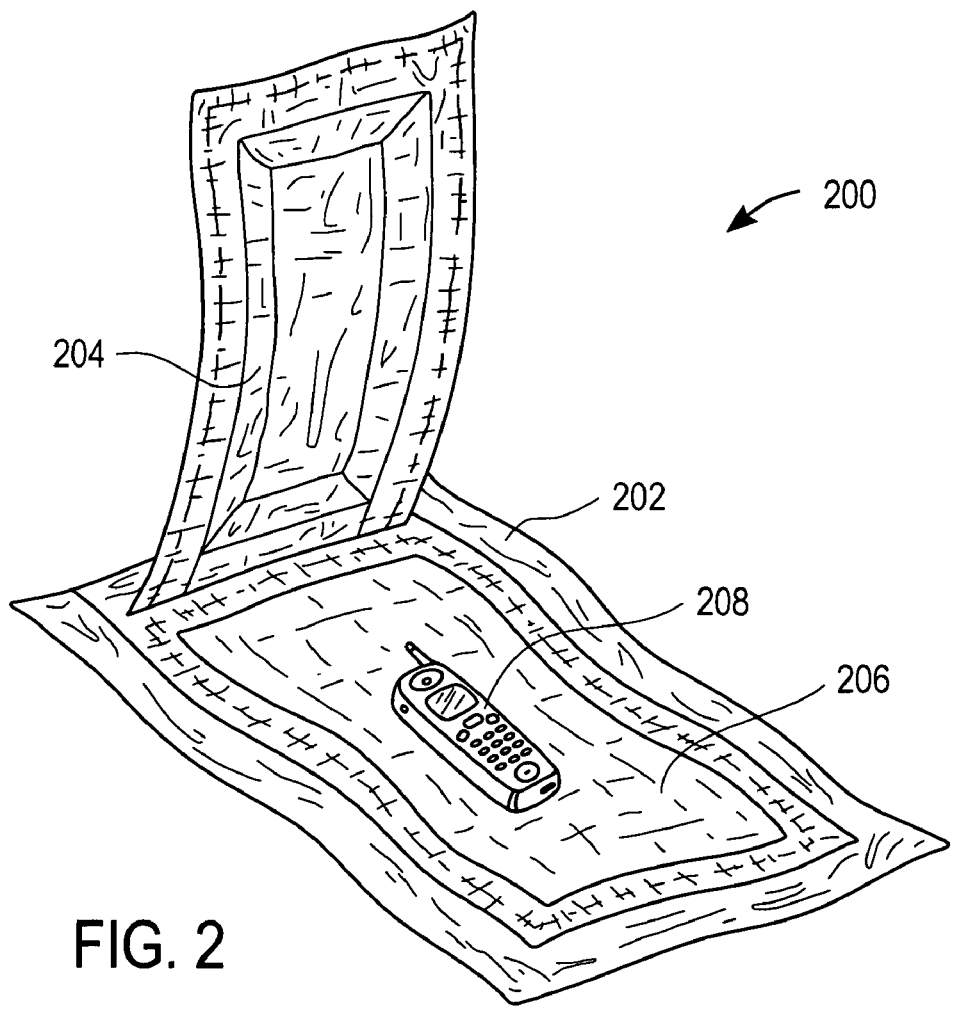
FIG. 2 is a perspective view of an isolation device with a lid in an open position in an embodiment in accordance with the invention.

With reference now to the figures and in particular with reference to FIG. 2, there is shown a perspective view of an isolation device with a lid in an open position in an embodiment in accordance with the invention. Isolation device 200 includes base 202, lid 204, and isolation area 206. Device 208 is placed inside isolation area 206 for shielding from outside interference, such as radio frequency (RF) interference and e-field interference. In this embodiment in accordance with the invention, device 208 is implemented as a cellular telephone that employs interference shielding during device testing. In other embodiments in accordance with the invention, device 208 may be implemented as any device requiring shielding from outside interference for any purpose. For example, device 208 may be implemented as a personal digital assistant (PDA) or a notebook computer.

A flexible shielding material, such as a metallic fabric, is used to construct isolation device 200 in this embodiment in accordance with the invention. One example of a flexible metallic fabric is a pre-fabricated nickel/copper fabric known as FlecTron®, manufactured by the Monsanto Company. In other embodiments in accordance with the invention, isolation device 200 may be assembled with other flexible shielding materials.

The flexible shielding material allows isolation device 200 to be constructed in any desired configuration. In the FIG. 2 embodiment, isolation device 200 is constructed in a rectangular-like shape. In other embodiments in accordance with the invention, isolation device 200 may be constructed in any desired shape. Additionally, only base 202 may be constructed with a flexible shielding material and lid 204 with a non-flexible shielding material in other embodiments in accordance with the invention. Alternatively, in yet other embodiments in accordance with the invention, lid 204 may be constructed with a flexible shielding material and base 202 with a non-flexible shielding material.

Figure 3:
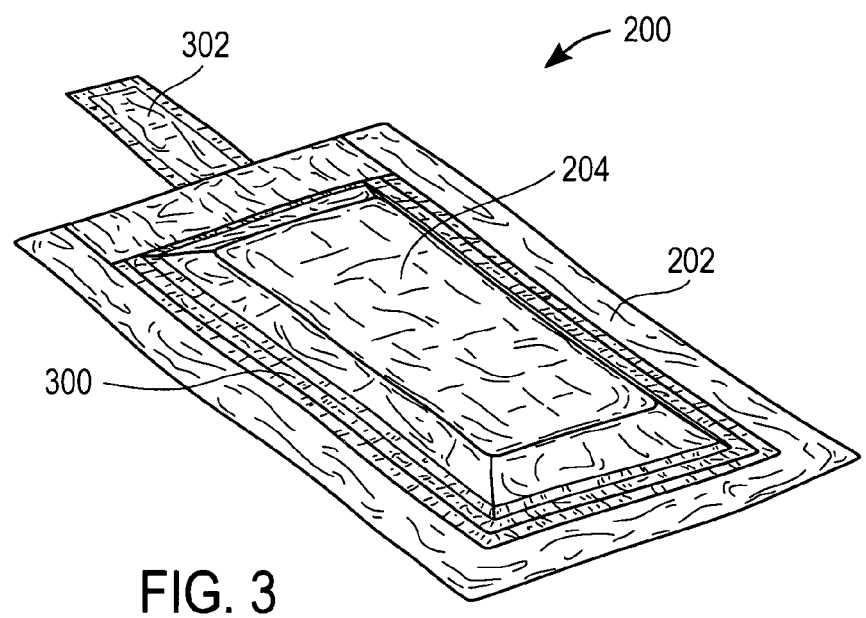
FIG. 3 is a perspective view of the isolation device of FIG. 2 with a lid in a closed position.

FIG. 3 is a perspective view of the isolation device of FIG. 2 with a lid in a closed position. A clasp 300 attaches lid 204 to base 202. Cable corridor 302 is a conduit that allows device 208 (see FIG. 2) to be connected to another device (not shown). For example, device 208 may be connected to a testing station by inserting a cable for the testing station into cable corridor 302. The cable passes through cable corridor 302 to connect to device 208 in isolation area 206.

Cable corridor 302 is constructed with the flexible shielding material in this embodiment in accordance with the invention. In other embodiments in accordance with the invention, cable corridor 302 may be implemented with non-flexible shielding materials. The dimensions of cable corridor 302 are determined by each application. In the embodiment of FIG. 3, the length of corridor 302 is determined by the waveguide beyond cutoff frequency. The waveguide beyond cutoff frequency causes frequencies less than the cutoff frequency to be attenuated such that the frequencies are not disruptive to device 208 in isolation area 206.

Figure 4:
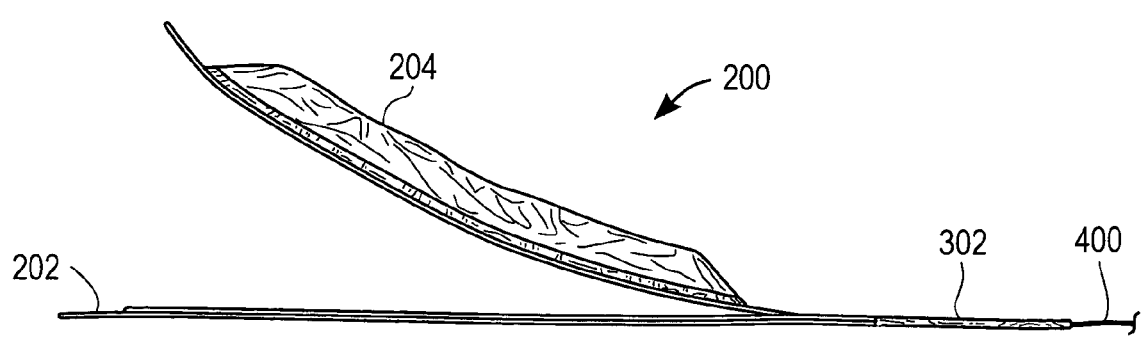
FIG. 4 is a side view of the isolation device of FIG. 2.

Referring now to FIG. 4, there is shown a side view of the isolation device of FIG. 2. A cable 400 is inserted into cable corridor 302 to connect with a device in the isolation area (not shown). Shielding material surrounds the device when lid 204 is closed and attached to base 202. In this embodiment in accordance with the invention, base 202, lid 204, and cable corridor 302 are formed using a single piece of shielding material. Other embodiments in accordance with the invention may construct shielding device 200 differently.

Figure 5:
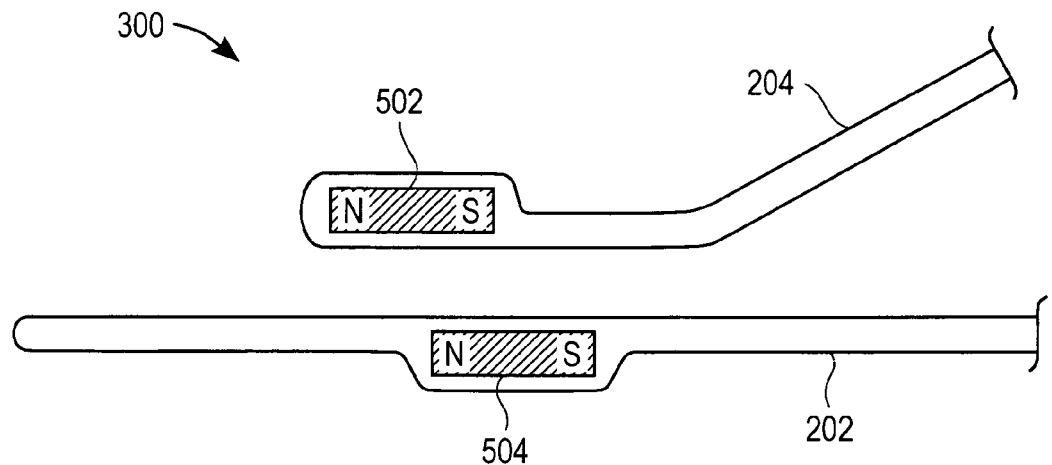
FIG. 5 is a cross-sectional view of a clasp used in the isolation device of FIG. 2.

FIG. 5 is a cross-sectional view of a clasp used in the shielding device of FIG. 2. Clasp 300 includes two magnetic components 502, 504. Magnetic components 502, 504 are implemented as flexible magnetic strips in this embodiment in accordance with the invention. Magnetic components 502, 504 are placed around the perimeter of the isolation area (not shown). The shielding material of base 202 and lid 204 folds around magnetic components 504 and 502, respectively. A galvanic connection is created between base 202 and lid 204 when magnetic components 502, 504 are aligned to attract each other. In other embodiments in accordance with the invention, different types of clasps or mechanisms that seal lid 204 to base 202 may be used.

Figure 6:
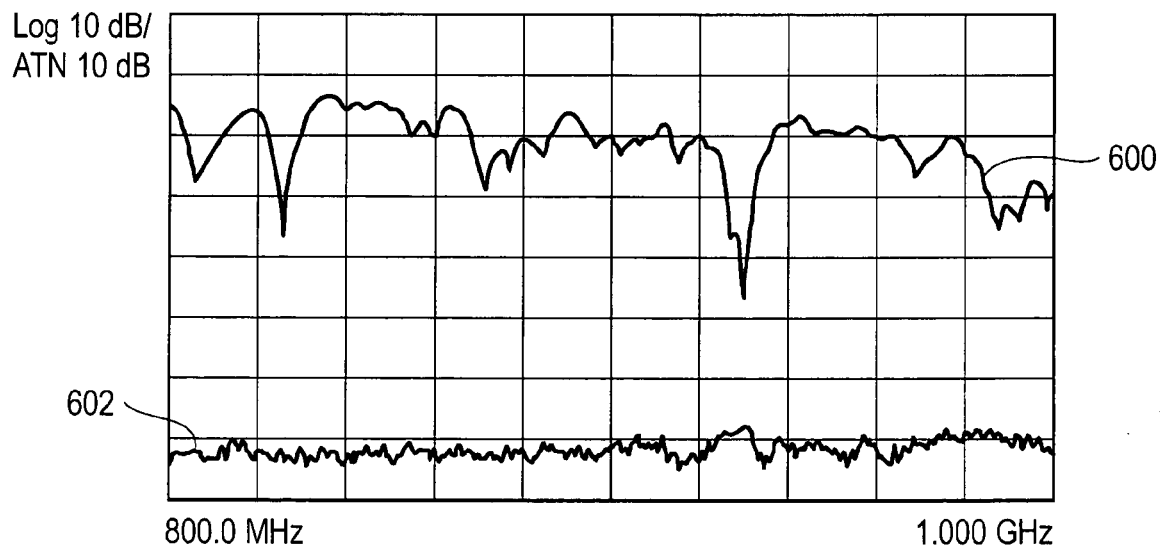
FIG. 6 is a plot of RF energy versus frequency for a lid in an open position and a lid in a closed position for the isolation device of FIG. 2.

Referring now to FIG. 6, there is shown a plot of RF energy versus frequency for a lid in an open position and a lid in a closed position for the shielding device of FIG. 2. Plot 600 illustrates the amount of outside interference measured between 800 MHz and 1 GHz frequency when lid 204 is in an open position. As is shown in FIG. 6, the amount of interference is relatively high and the plot includes considerable variations in the level of interference. Outside interference negatively impacts devices during certain operations and product testing.

Plot 602 depicts an amount of outside interference present when lid 204 is in a closed position. As can be seen, the level of interference is reduced and remains relatively constant during the frequency range of 800 MHz to 1 GHz.

The invention claimed is:

1. A shielding device, comprising:
   a lower portion including art isolation area;
   a conduit having a first opening in the isolation area and a second opening outside the isolation area, wherein at least one dimension of the conduit is based on attenuating a frequency;
   an upper portion operable to detachably close over and cover the isolation area and operable to detachably open to expose the isolation area, wherein at least one of the lower and upper portions is formed entirely with a flexible shielding material; and
   a detachable magnetic clasp to attach the upper portion to the lower portion when the upper portion covers the isolation area.

2. The shielding device of claim 1, wherein the at least one dimension of the conduit comprises a length and the length is determined by a waveguide beyond cutoff frequency.

3. The shielding device of claim 1, wherein the conduit comprises a flexible shielding material.

4. The shielding device of claim 1, wherein both the upper and lower portions comprise a flexible shielding material.

5. The shielding device of claim 4, wherein the magnetic clasp comprises:
   a first magnetic component attached to a perimeter of the upper portion; and
   a second magnetic component attached to a perimeter of the lower portion corresponding to the perimeter of the upper portion, wherein the flexible shielding material of the upper and lower portions folds around the first and second magnetic components, respectively, to create a galvanic connection between the upper portion and the lower portion when the first and second magnetic components are aligned to attract each other.

6. A shielding device, comprising:
   a lower portion including an isolation area;
   a conduit having a first opening in the isolation area and a second opening outside the isolation area, wherein a length of the conduit is based on attenuating a frequency and the length is determined by a waveguide beyond cutoff frequency;
   an upper portion operable to detachably dose over and cover the isolation area and operable to detachably open to expose the isolation area, wherein at least one of the lower and upper portions is formed entirely with a flexible shielding material; and
   a detachable magnetic clasp to attach the upper portion to the lower portion when the upper portion covers the isolation area.

7. The shielding device of claim 6, wherein both the upper and lower portions comprise a flexible shielding material.

8. The flexible shielding device of claim 7, wherein the magnetic clasp comprises:
   a first magnetic component attached to a perimeter of the upper portion; and
   a second magnetic component attached to a perimeter of the lower portion corresponding to the perimeter of the upper portion, wherein the flexible shielding material of the upper and lower portions folds around the first and second magnetic components, respectively, to create a galvanic connection between the upper portion and the lower portion when the first and second magnetic components are aligned to attract each other.

9. The shielding device of claim 6, wherein the conduit comprises a flexible shielding material.

10. A method for fabricating a flexible shielding device, comprising:
    forming an isolation area in a tower portion of the shielding device;
    forming a conduit having a first opening in the isolation area and a second opening outside the isolation area, wherein at least one dimension of the conduit is formed to attenuate a frequencv;
    forming an upper portion designed to detachably close over and cover the isolation area and to detachably open to expose the isolation area, wherein at least one of the lower and upper portions is formed entirely with a flexible shielding material; and
    providing a detachable magnetic clasp to attach the upper portion to the lower portion of the shielding device when the upper portion is closed over the isolation area.

11. The method of claim 10, wherein forming a conduit having a first opening in the isolation area and a second opening outside the isolation area, wherein at least one dimension of the conduit is formed to attenuate a frequency comprises forming a conduit having a first opening in the isolation area and a second opening outside the isolation area, wherein a length of the conduit is formed to attenuate a frequency and the length is determined by a waveguide beyond cutoff frequency.

* * * * *

UNITED STATES PATENT AND TRADEMARK OFFICE
CERTIFICATE OF CORRECTION

| | | |
|---|---|---|
| PATENT NO. | : 7,075,798 B2 | Page 1 of 1 |
| APPLICATION NO. | : 10/859274 | |
| DATED | : July 11, 2006 | |
| INVENTOR(S) | : Hendrickson | |

It is certified that error appears in the above-identified patent and that said Letters Patent is hereby corrected as shown below:

In column 3, line 27, in Claim 1, delete "art" and insert -- an --, therefor.

In column 4, line 8, in Claim 6, delete "dose" and insert -- close --, therefor.

In column 4, line 34, in Claim 10, delete "tower" and insert -- lower --, therefor.

In column 4, line 39, in Claim 10, delete "frequencv;" and insert -- frequency; --, therefor.

Signed and Sealed this

Fifth Day of December, 2006

JON W. DUDAS
*Director of the United States Patent and Trademark Office*